United States Patent [19]
Fry

[11] Patent Number: 5,115,207
[45] Date of Patent: May 19, 1992

[54] AUTOMATIC SIGNAL PARAMETER CONTROL

[75] Inventor: David W. Fry, Sawbridgeworth, Great Britain

[73] Assignee: STC PLC, London, England

[21] Appl. No.: 555,292

[22] Filed: Jul. 19, 1990

[30] Foreign Application Priority Data

Jul. 26, 1989 [GB] United Kingdom ............... 8917096
Jan. 11, 1990 [GB] United Kingdom ............... 9000607

[51] Int. Cl.⁵ ............................................. H03G 3/30
[52] U.S. Cl. ............................. 330/284; 328/155; 330/136
[58] Field of Search ............ 330/129, 278, 279, 280, 330/284, 310, 107, 136; 307/511; 328/155

[56] References Cited

U.S. PATENT DOCUMENTS

| | | | |
|---|---|---|---|
| 3,919,657 | 11/1975 | Howlett | 330/51 |
| 4,456,889 | 6/1984 | Kumar | 330/279 |
| 4,554,511 | 11/1985 | Braun | 330/9 |
| 4,851,842 | 7/1989 | Iwamatsu | 330/284 X |

FOREIGN PATENT DOCUMENTS

| | | |
|---|---|---|
| 627249 | 9/1961 | Canada ............... 330/136 |
| 0114066 | 7/1984 | European Pat. Off. . |
| 2439506 | 5/1980 | France . |
| 1036647 | 7/1966 | United Kingdom . |
| 2147165 | 5/1985 | United Kingdom . |

OTHER PUBLICATIONS

Journal of the Audio Engineering Society, vol. 32, No. 5, May 1984, pp. 316-327, New York, US. G. W. McNally "Dynamic range Control of digital audio signals".
Patent Abstracts of Japan, vol. 13, No. 196(E-755) May 10, 1989 (JP-A-01018308 Toshiba).
Patent Abstracts of Japan, vol. 3, No. 139(E-152) Dec. 17, 1979 (JP A 54117659 Nec).
Patent Abstracts of Japan, vol. 9, No. 288 (E-358) Nov. 15, 1985 (JP A 60 130 207 Nippon).

Primary Examiner—Steven Mottola
Attorney, Agent, or Firm—Lee, Mann, Smith, McWilliams, Sweeney & Ohlson

[57] ABSTRACT

A fact acting automatic gain control system comprising a single or serial multistage arrangement. In one multistage embodiment (FIG. 1) each stage (13) has a first state with a predetermined gain and a second state with unity gain. The output of each stage determines what state is finally adopted although initially when a signal is input it is in the first state due to the action of a sequence controller (14). The predetermined gain values may comprise a binary sequence which descends in the direction towards the output. If the level detector (7) threshold is exceeded, the stage is set to the second state. A particular use of the system is to ensure burst mode pulses reaching a receiver are of similar amplitude. A similar arrangement can be employed for phase alignment ratther than gain control. In another multistage embodiment (FIG. 2) a sequence controller is not required and the input signal level is used to set the required state of an amplifier (17) before the input signal is applied to the amplifier, by means of a comparator (15) and a delay (16). An analogue equivalent of the FIG. 2 embodiment (FIG. 3) is a single stage arrangement.

9 Claims, 3 Drawing Sheets

AUTOMATIC SIGNAL PARAMETER CONTROL

BACKGROUND OF THE INVENTION

This invention relates to automatic signal parameter control such as automatic gain-control and in particular, but not exclusively, to fast acting amplifier systems for burst mode transmission systems.

In the case of an optical local area network such as a number of subscribers connected by optical fibre to a local exchange, each subscriber being allocated a respective time slot for transmission, for example as in a time division multiple access (TDMA) arrangement, then simply because of the distances involved and the number of fibre splits, there will be an optical signal level difference as seen at the exchange between the signal packets received from the various subscribers. In order to achieve a high efficiency network, the time slots need to be compressed as close together as possible, so that a receiver at the exchange will see significant variations in amplitude in a very short period of time. An object of the present invention is to compensate for these variations.

SUMMARY OF THE INVENTION

According to one aspect of the present invention there is provided an arrangement serving to control a parameter of a signal automatically, which arrangement includes first means having different states in which said first means can affect the parameter accordingly, and second means for measuring the parameter of the signal and changing the state of the first means as appropriate.

According to another aspect of the present invention there is provided a serial multistage arrangement serving to control a parameter of a signal automatically, which signal is applied successively to each stage, wherein each stage has a first state in which a first predetermined amount of change to the parameter of the signal as input thereto is provided and a second state in which a second predetermined amount of change to the parameter is provided, and including means such that initially each stage is in the first state but such that in dependence on the signal at that stage, the stage can be set to the second state.

BRIEF DESCRIPTION OF THE DRAWINGS

Embodiments of the invention will now be described with reference to the accompanying drawings in which.

DESCRIPTION OF THE PREFERRED EMBODIMENTS

Figure 1:
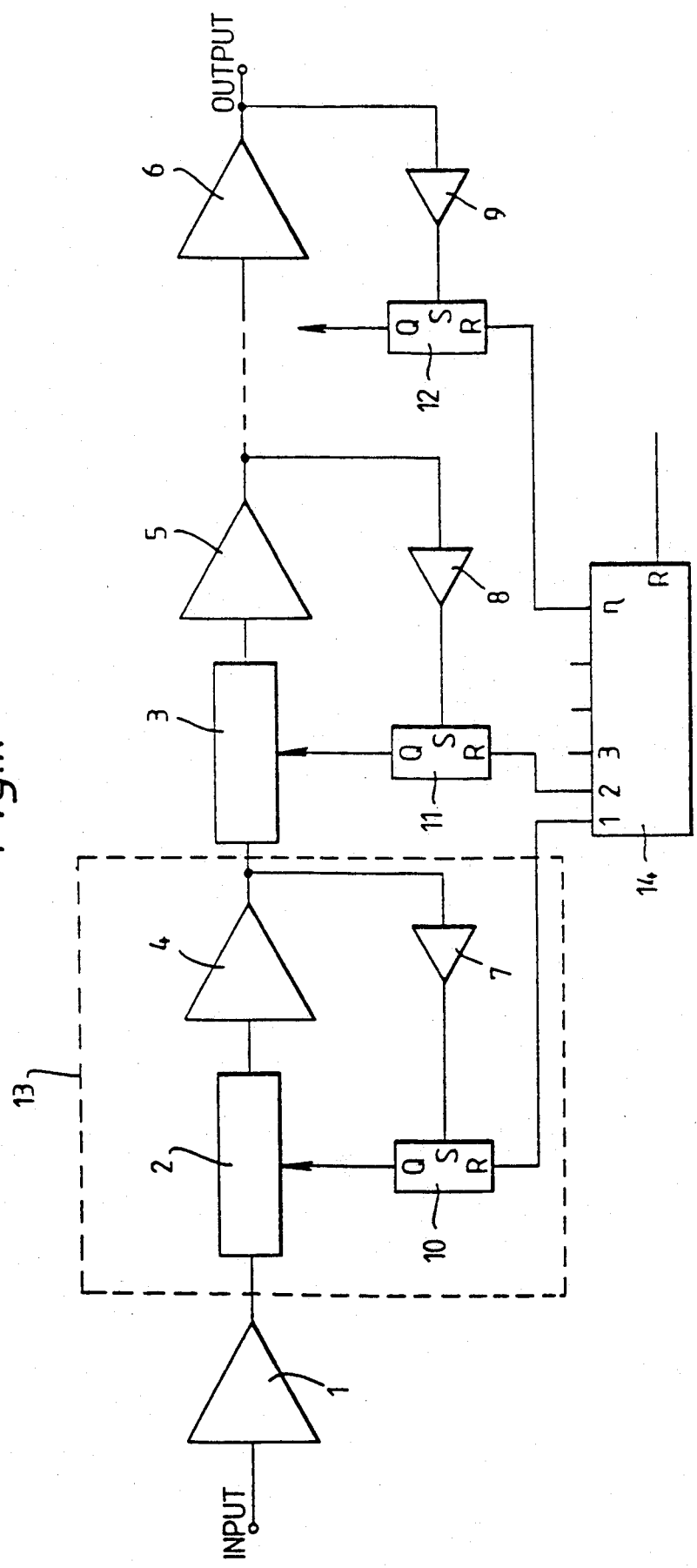
FIG. 1 is a schematic diagram of one embodiment of a fast-acting a.g.c.amplifier.

The amplifier shown in FIG. 1 of the drawing comprises a first amplifier 1 to which an input digital signal packet is applied, and a serially connected alternate sequence of switchable attenuators such as 2, 3 and amplifiers such as 4, 5, 6. Associated with each attenuator is a following amplifier, a respective level detector such as 7, 8, 9 and a respective latch such as 10, 11, 12, and these four elements together comprise a stage. The first stage 13 is constituted by attenuator 2, amplifier 4, level detector 7 and latch 10. There are a plurality of stages (n as shown). The values of the components are chosen so that the first stage either provides a gain of unity or some predetermined value, for example 8dB, the second stage (elements 3, 5, 8 and 11) either provides a gain of unity or some predetermined value, for example 4dB. For some applications the maximum gain of the succeeding stages will follow a descending binary sequence e.g. 8dB, 4dB, 2dB. The resetting of the latches 10, 11, 12 is under the control of a sequencer 14, which is such that each stage is reset in turn. The sequencer is itself reset when a new signal level (packet) is received which must be adjusted.

On receipt of an incoming signal packet the sequencer first resets the latch of the first stage, the attenuator thus being switched to cause the first stage to have maximum gain. The incoming signal is amplified at amplifier 1 and then applied to the first stage. If the amplitude of the first edge of the signal at the output of amplifier 4 is greater than the threshold of the level detector 7 the latch is set and the attenuator 2 switched so as to cause the first stage to have unity gain. In this case the signal output from the first stage and applied to the second stage is effectively not amplified other than by amplifier 1. If the amplitude of the first edge of the signal at the output of amplifier 4 was less than the threshold of the level detector 7, the latch is not set and the signal output from the first stage and applied to the second stage will have been amplified by amplifier 1 and the first stage. The latch 8 of the second stage is then reset by sequencer 14 and the front edge of signal input to the second stage is processed in a similar way, the gain of the second stage initially being set to a maximum value, typically less than that of the first stage, but being set to unity if the threshold of the associated level detector is exceeded, in which case it is not further amplified. After passage through each of the stages, the amplitude of the signal packet output from the last stage will be at a level determined by its input level. Receipt of the next signal packet requiring adjustment causes resetting of the sequencer as mentioned above and this new signal packet will be similarly processed, being amplified or not by the various stages as appropriate for its input amplitude, and it will be output from the last stage with an amplitude similar to that of the first signal packet. Thus variations in the amplitude of incoming packets are automatically compensated and the following electronics of the receiver (not shown) are not subjected to unduly varying input signal levels.

Once a latch of a stage is set in accordance with the output of that stage it cannot be reset since the sequencer will by then have moved on to reset the following stage. Thus the arrangement cannot oscillate. It is fast acting yet inherently stable. Once a stage is set in its correct state it cannot be reset until the sequencer is reset. Resetting of the sequencer can be occasioned by recognition of the absence of transitions at the end of the amplifier (stage) chain or derived by inspection of the data of the signal to locate an "end-of-data" flag. As will be appreciated this means that the packets of data can be very closely positioned. The sequencer ensures that each stage is switched in turn and this is necessary since if all stages were reset together a signal of sufficiently high amplitude would switch every stage and no gain would be achieved. It is important to allow only one stage to be reset at a time before the edge passes through one transition and it is necessary to have one transition at full amplitude to ensure that the true maximum signal level has been sampled. The arrangement is particularly appropriate for signals of systems where the data packets have a preamble which has "throw-away" transitions designed for setting the receiver up both in amplitude and phase before the data proper arrives.

Whereas the above arrangement is for amplitude control, this is not the only possibility. Alternatively, a similar arrangement could achieve phase control, in which case switchable phase shifters would replace the switchable attenuators. Thus phase alignment can be achieved. The detectors would detect phase rather than level.

Whilst the above example quoted a descending stage gain 8dB, 4dB, 2dB etc as well as unity gain, particular applications would require other gain settings. Consecutive stages of equal gain may be employed for extending the dynamic range. Other possibilities are having switched attenuator/unity gain stages, for extending the I/P overload characteristics. With the above example, the response time, that is how long a stage takes to settle to be next gain state, is of the order of 5ns. This digital arrangement is very much faster than achievable with conventional analogue a.g.c. arrangements and peak detectors are not required. For the particular telecommunications application that is described it is considered that five stages would be the optimum. The circuitry involved is particularly suitable for providing in integrated circuit form using ECL (emitter coupled logic). Whereas the arrangement is particularly applicable to burst mode communications this is not the only possible use. It should be noted that the arrangement of FIG. 1 also provides a direct digital read-out of the signal power level from the level detectors and thus, for example, the local exchange where the arrangement is situated would be provided with a digital read-out of the power transmitted from each subscriber. Such information would also enable efficient network management to be achieved. Such an arrangement could also be used at the subscriber's transmitter to provide digital read out of the power level from the transmitter laser's monitor photodiode which is disposed at the back face of the laser.

In a variant of the design described so far, instead of just a single level detector 7 i.e. above threshold or below threshold, a quantising detector may be employed. This would enable setting of more than one stage at once. For example when setting two stages and considering increasing signal levels, initially both stages are set to gain; next, the first stage is set to gain and the second to unity gain; subsequently the first stage is set to unity gain and the second to gain; and finally both stages are set to unity gain.

A fast acting auto-gain control for burst mode systems is therefore provided and basically comprises a serial chain of switchable attenuators and amplifiers through which entire chain the data to be processed is passed without the need for data switching. Each attenuator and the following amplifier are part of a respective stage which has either of two predetermined gain values possibilities, or either of unity gain and one particular value of gain. The output of each stage determines which gain state that stage should adopt. The particular values of gain of the stages in the described embodiment are in some form of descending binary sequence for the amplifiers 4, 5...6. A sequencer allows each stage to be reset in turn. Once a sequence is completed the gain is set and held until a new signal level is received which needs to be adjusted.

The arrangement described with reference to FIG. 1 has a disadvantage in that the number of cascaded stages which are possible is determined by the sequencer design. If more or less stages are required the sequencer must be correspondingly redesigned. An arrangement which performs the same function but involves a truly sequential process so that any number of stages can be cascaded, without the need to redesign part of the equipment, is illustrated schematically in FIG. 2.

Figure 2:
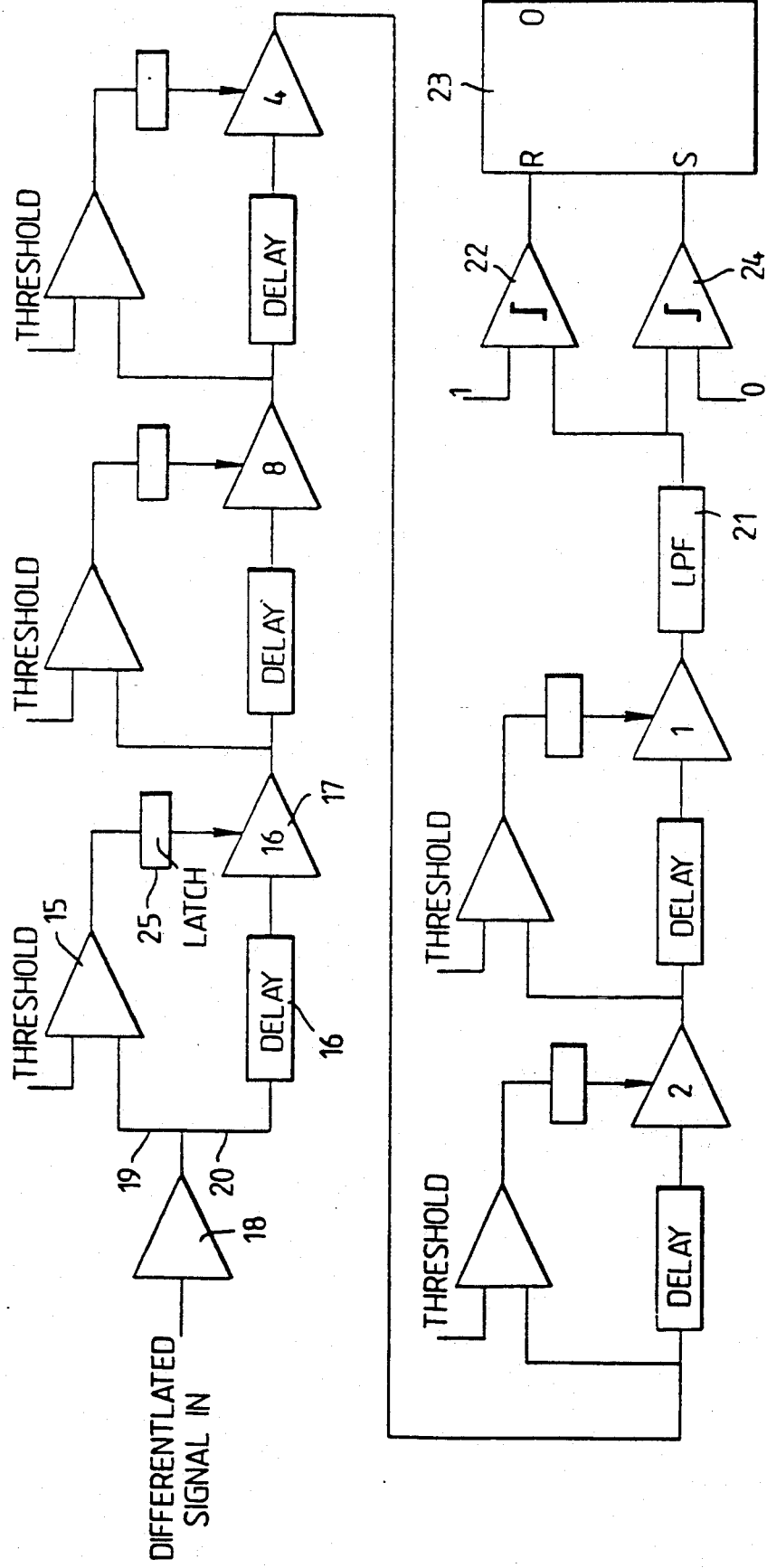
FIG. 2 is a schematic diagram of another embodiment of a.g.c. amplifier.

Each stage comprises a comparator such as 15, a latch 25, a delay such as 16 and amplifier 17. The gain state of the amplifier is switchable between a high gain state and a low gain state, for example, unity gain. Thus an incoming signal is differentiated, amplified at 18 and then applied to two signal paths 19 and 20. Path 19 leads to comparator 15 which has a threshold level set so as to prevent the amplifier 17 from saturating. The path 20 passes through the delay 16 to the amplifier 17. The delay is sufficient for the comparator 15 to have sampled the peak input signal amplitude and to have latched latch 25, for example an R-S flip-flop or similar device, and to have switched the gain state of the amplifier 17, if necessary, before the data signal actually arrives at the amplifier's input. Because this is a truly sequential process any number of such stages can be cascaded. The amplifiers 17 are initially set to their high gain states, in the example illustrated successive stages have high gain states of 16dB, 8dB, 4dB, 2dB and 1dB, although these are not the only possibilities, the number of stages and their gains being determined by the particular application. Typically the delays 16 are comprised by 25nS delay lines and the overall delay between the signal input and the signal output is approximately 200ns. The main advantage of the arrangement of FIG. 2 is that no bits of data from an incoming "packet" are lost, and compared with fibre delays in the system, the receiver delay is negligible. At the end of a data packet the latches 25 and therefore the gain stages are reset, into their high gain state, i.e amplifiers 17 are reset, to be ready to detect the next incoming packet.

The output of the last stage of the sequence illustrated in FIG. 2 is applied to a low pass filter 21 whose output is split between two signal paths one of which is applied via a comparator referenced to logic "1", comparator 22, to the reset input of latch 23, and the other of which is applied via a comparator referenced to logic "0", comparator 24, to the set input of latch 23. The signal output from the arrangement is at the Q port of latch 23.

Figure 3:
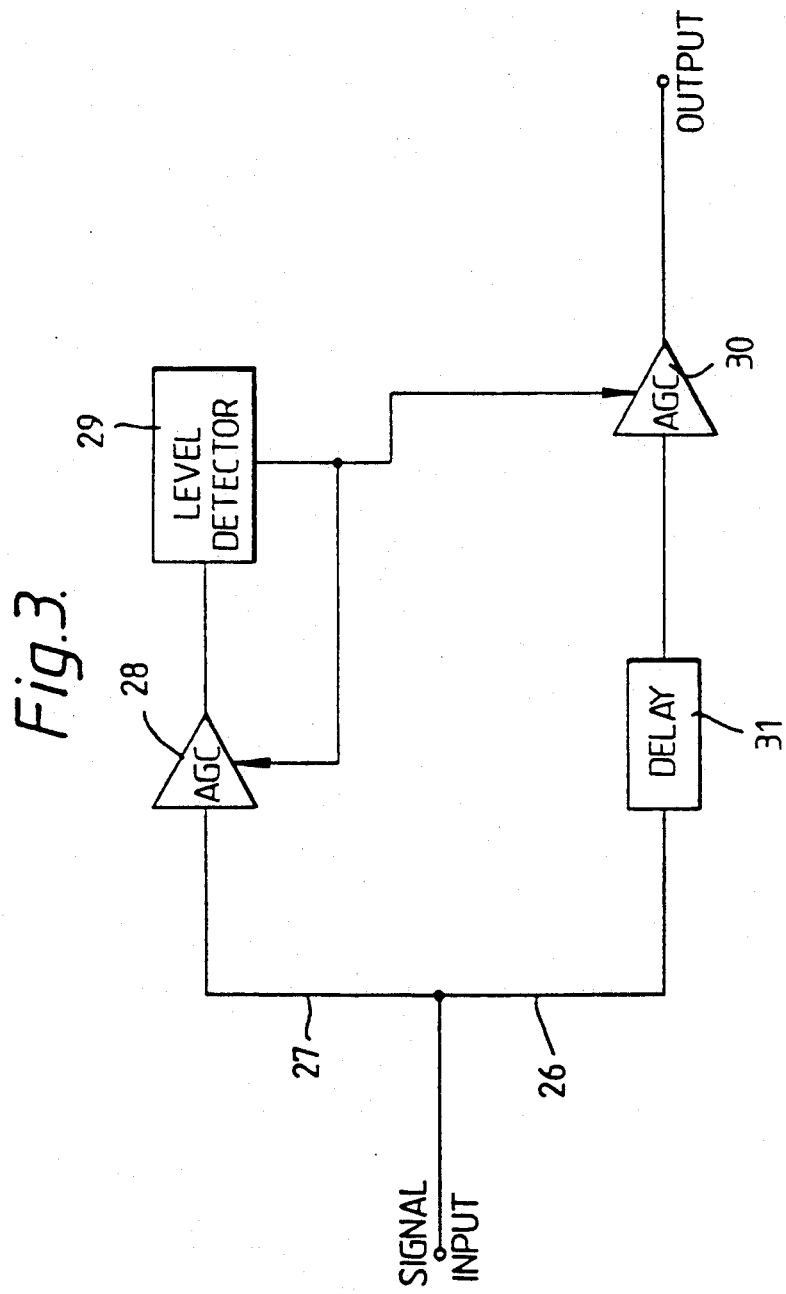
FIG. 3 is an analogue equivalent to the arrangement of FIG. 2.

An alternative and analogue equivalent to the arrangement of FIG. 2 is shown in FIG. 3. Instead of many digital stages, a single analogue stage is used. The incoming signal is split between the two paths, 26 and 27 of FIG. 3. Path 27 leads to a conventional analogue high speed a.g.c. amplifier 28 whose gain is controlled by the signal level detected at 29. The same control signal is fed to an identical a.g.c. amplifier 30 and held for the duration of the packet. The input signal via path 26 is delayed by element 31 such that the a.g.c. amplifier 30 has already established its correct gain setting as determined via path 27 etc. At the detected end of packet, the level detect must be reset to put amplifiers 28 and 30 into the high gain state ready for the next packet.

The arrangements of FIGS. 2 and 3 involve the simple principle of measuring the signal's amplitude (or alternatively its phase) and correcting for it before the signal actually arrives, at the amplifier or other element of the stage. This may be of particular importance in burst-mode and TDMA (Time Division Multiple Access) systems for improving network efficiency by reducing the number of redundant bits required at the head of a packet of data.

I claim:

1. An automatic gain control arrangement for TDMA applications and serving to control the amplitude of digital packet signals automatically, a respective fixed gain being provided for the duration of each packet, which arrangement includes first means having different states in which the first means can affect the amplitude accordingly, and second means for measuring the amplitude of the packet signals at an input to said arrangement and changing the state of the first means as appropriate, the arrangement including a delay element and a first a.g.c. amplifier, comprising said first means, disposed in series between said input and an output of said arrangement; a second a.g.c. amplifier, identical to the first a.g.c. amplifier and comprising said second means, coupled to said input; and a level detector coupled to the output of said second a.g.c. amplifier, which level detector controls the gain of the first and second a.g.c. amplifiers.

2. A serial multistage arrangement serving to control a parameter of digital packet signals automatically, the digits of each said packet being supplied successively to each stage, wherein each stage has a first state in which a first predetermined amount of change to the parameters of the digit as input thereto is provided and a second state in which a second predetermined amount of change to the parameter is provided, and including means such that initially each stage is in the first state but such that in dependence on the digit as input to that stage, the stage can be set to the second state, and wherein each stage includes means switchable between said first and second states and which perform said parameter control, means to measure said parameter of the digit as input to a said stage and to switch the switchable means to the second state if appropriate, and delay means whereby the digit as input to a said stage is applied to said switchable means for parameter control only after said measurement and any necessary switching have been performed, and wherein the states of the stages are set and held in sequence from an input stage to an output stage of the multistage arrangement for the duration of each packet received, state changes being permitted only when an end of packet signal is received.

3. An arrangement as claimed in claim 2 wherein said parameter is amplitude and comprising an automatic gain control system.

4. An arrangement as claimed in claim 2 wherein said parameter is phase and comprising an automatic phase alignment system.

5. A serial multistage automatic gain control arrangement for TDMA applications and serving to control the amplitude of digital packet signals automatically, a respective fixed gain being provided for each individual packet, the digits of each said packet being applied successively to each stage, wherein each stage has a first state in which a first predetermined amount of change to the amplitude as input thereto is provided and a second state in which a second predetermined amount of change to the amplitude is provided, and including means such that initially each state is in the first state but such that in dependence on the digit as output from that stage, the stage can be set to the second state, and wherein each stage includes a switchable attenuator and an amplifier in series, the second state is unity gain and the first state is a respective predetermined value of gain.

6. A serial multistage automatic gain control arrangement serving to control the amplitude of a digital packet signal automatically, the digits of which signal are applied successively to each stage, wherein each stage has a first state in which a first predetermined amount of change to the amplitude of the digit as input thereto is provided and a second state in which a second predetermined amount of change to the amplitude is provided, and including means such that initially each stage is in the first state but such that in dependence on the digit as input to that stage, the stage can be set to the second state, and wherein each stage includes a delay element and a switchable amplifier in series between the stage input and output, which amplifiers are switchable between first and second gain states and have respective predetermined values of gain in the first gain states, and wherein the states of the stages are set and held in sequence from an input stage to an output stage of the multistage arrangement for the duration of each packet received, state changes being permitted only when an end of packet signal is received.

7. A serial multistage automatic phase alignment arrangement for TDMA applications and serving to control the phase of a digital packet signal automatically, the digits of which signal are applied successively to each stage, wherein each stage has a first state in which a first predetermined amount of change to the phase of the digit as input thereto is provided and a second state in which a second predetermined amount of change to the phase is provided, and including means such that initially each stage is in the first state but such that in independent on the digit at that stage, the stage can be set to the second state.

8. An arrangement as claimed in claim 5 wherein the predetermined values of gain comprise a binary sequence which descends in the direction towards the output of the arrangement, wherein each stage further including a respective level detector coupled to the output of the respective amplifier, and a respective latch whereby the stage is controlled to provide the first state when a digit is initially input thereto and whereby the stage is set to provide the second state when a threshold of the level detector is exceeded, wherein the arrangement further includes a sequence controller whereby each stage is controlled in turn to provide the first state when a digit is input thereto, wherein the arrangement serve to compensate for differences in amplitude of a succession of incoming packets and the sequence controller is reset upon receipt of a packet requiring different compensation to that of a previous packet, and wherein the signals at the level detectors provide a direct digital readout of the packet level.

9. An arrangement as claimed in claim 5, wherein the predetermined values of gain comprise a binary sequence which descends in the direction towards the output of the arrangement, wherein each stage includes a respective comparator between the stage input and a control port of the switchable amplifier, the output of which comparator serves to switch the amplifier to the second state if the amplitude of the input digit exceeds a respective threshold, and wherein the delay elements are comprised by delay lines.

* * * * *